United States Patent [19]

Kassel et al.

[11] 4,298,671

[45] Nov. 3, 1981

[54] TELLURIUM LAYER ALLOWS VAPOR DEPOSITION OF CRYSTALLINE SELENIUM THEREON IN MAKING DOUBLE LAYER ELECTROPHOTOGRAPHIC RECORD MATERIAL

[75] Inventors: Karl-Heinz Kassel; Manfred Lutz, both of Warstein; Josef Stuke, Marburg; Hubert Walsdorfer, Warstein, all of Fed. Rep. of Germany

[73] Assignee: Licentia Patent-Verwaltung-G.m.b.H., Frankfurt am Main, Fed. Rep. of Germany

[21] Appl. No.: 12,858

[22] Filed: Feb. 16, 1979

[30] Foreign Application Priority Data

Mar. 1, 1978 [DE] Fed. Rep. of Germany ....... 2808757

[51] Int. Cl.³ .............................................. G03G 5/05
[52] U.S. Cl. ................................... 430/128; 430/134; 430/130; 430/60; 430/61; 427/76

[58] Field of Search .......................... 96/1.5 R, 1.5 N; 23/301; 423/508, 509, 510; 427/76; 430/60, 61, 128, 134, 130

[56] References Cited

U.S. PATENT DOCUMENTS

| | | | |
|---|---|---|---|
| 3,655,377 | 4/1972 | Sechak | 96/1.5 |
| 4,021,375 | 5/1977 | Moore | 427/76 |
| 4,094,675 | 6/1978 | Beschoner et al. | 96/1.5 |

FOREIGN PATENT DOCUMENTS 50-39949 12/1975 Japan ................................... 427/76

*Primary Examiner*—John D. Welsh
*Attorney, Agent, or Firm*—Spencer & Kaye

[57] ABSTRACT

In a process for producing an electrophotographic recording material composed of a double layer of amorphous and crystallized selenium on an electrically conductive carrier, a layer of tellurium having a thickness of 10 to 500 nm is applied onto the surface of the carrier, and selenium is then vapor-deposited onto the tellurium layer to a thickness of 20 to 100μ to form the double layer.

6 Claims, No Drawings

TELLURIUM LAYER ALLOWS VAPOR DEPOSITION OF CRYSTALLINE SELENIUM THEREON IN MAKING DOUBLE LAYER ELECTROPHOTOGRAPHIC RECORD MATERIAL

BACKGROUND OF THE INVENTION

The present invention relates to a method for fabricating an electrophotographic recording material containing a double layer composed of amorphous and crystallized selenium applied to an electrically conductive substrate.

Electrophotographic copying methods and apparatus for practicing such methods are widely used in the duplicating art. They utilize the property of photoconductive materials to change its electric resistance when exposed to an activating radiation.

After imparting an electrical charge, a layer of such photoconductive material and exposing the photoconductive layer to an activating radiation in a pattern corresponding to an optical image, a latent electrical charge image can be produced thereon to correspond to the optical image. At the exposed locations, the conductivity of the photoconductive layer increases to such an extent that the electrical charge thereat can flow off, at least in part, but in any case to a greater extent than at the unexposed locations, through the conductive substrate, while at the unexposed locations the electrical charge remains essentially unchanged. The pattern of the subsisting charge can be made visible with an image powder, a so-called toner, and the resulting toner image, if required, can be transferred to paper or some other carrier.

Organic as well as inorganic substances are used as the electrophotographically active substances. Among them selenium, selenium alloys and compounds containing selenium have gained particular significance. They perform well, particularly when in the amorphous state, and have found manifold uses in practice.

The change in the electrical conductivity of a photoconductor depends on the intensity and the wavelength of the radiation employed. In the range of visible light, which is preferred for practical use in electrophotography, amorphous selenium exhibits high sensitivity on the blue side, i.e. in the short-wave range, while on the red side, or in the long-wave range, it exhibits only slight sensitivity.

This has the result that on an electrophotographic plate, a red character is reproduced exactly the same as a black character which under certain circumstances, particularly when the original is in color, has drawbacks for practical use; a black character on a red background, or vice versa, for example, will not be distinguishable from its background and can therefore not be identified.

It is known that crystallized selenium, in contrast to amorphous selenium, is extremely sensitive to red. Thus, with its use, the part of the visible spectrum above 650 nm can also be utilized. However, because of its high dark conductivity, i.e. its characteristic of being such a good conductor of electrical current even in the unexposed state that a charge applied to its surface cannot be maintained long enough for electrophotographic purposes, crystallized selenium has not been considered desirable for electrophotographic purposes.

A photoconductive material which is sensitive to red as well as blue and simultaneously is characterized by low dark conductivity, is a combination of amorphous and crystallized selenium. The two selenium forms may, for example, be in a layer structure in which first a layer of crystallized selenium is applied to a conductive substrate and then, thereupon, a layer of amorphous selenium.

The manufacture of such a double photoconductive layer is extremely difficult because, for perfect operation, i.e. particularly for uniform red sensitivity, it is necessary that the lower layer crystallize completely uniformly, and in always the same manner over the entire surface area of the photoconductor so that the layer completely covers the substrate and is of a uniform and sufficient thickness.

During conventional thermal treatment of a vapor-deposited amorphous layer during or after the vapor-deposition process in order to produce crystallization under the influence of higher temperatures, such uniformity can be produced only with difficulty, if at all. Firstly, a minimum temperature of about 70° C. is required to produce crystallization, and secondly, the temperature should be kept as low as possible in order to produce the best possible uniformity of crystallization. For these reasons a narrow temperature range must be set during the vapor-deposition process and must be kept constant, which requires considerable expenditures particularly for large scale production, with the added impediment that the temperature regulation must take place in a vacuum.

Moreover, crystallization is dependent to a particular degree on the unpredictable presence of other crystal seeds such as surface inhomogeneities, which initiate spontaneous crystallization that is difficult to influence, and depends on the variables of the selenium batch as well as on the variables of the individual substrate. With the crystal seed formation already being so irregular, there can be no assurance that the further crystallization can proceed with the necessary uniformity.

If, on the other hand, the procedure is effected at a higher temperature in order to better assure that the crystallization of the lower partial layer is complete, there again exists the danger that the upper partial layer, which, in order to maintain its sensitivity range, must remain in the amorphous state, also changes more or less intensively and irregularly to the crystallized state, which is just as undesirable.

An article by Kohei Kiyota and Kunihiko Tasai, entitled "Selenium Element for Photo-Electrostatography", published in the periodical *Fujitsu Scientific and Technical Journal,* December, 1975, discloses that a photoconductive double layer of crystallized and amorphous selenium can be produced by vapor-depositing selenium onto a layer of manganese, the manganese acting as a crystallization seed for the selenium. The conversion of the initially amorphous selenium into the crystallized form is accomplished by subsequent tempering which takes place at about 80° C. in order to attain a conversion speed which is high enough to cause a satisfactorily short conversion time to be required. The drawback of the selection of such a high conversion temperature is the above-described danger that the upper, amorphous partial layer then also changes to the crystallized state. Thus this process likewise requires the maintenance of a very closely defined temperature range. Moreover, after the vapor-deposition step there still is required an additional process step for tempering.

SUMMARY OF THE INVENTION

It is an object of the present invention to produce an electrophotographic recording material composed of an electrically conductive substrate with a photoconductive double layer thereon of crystallized and amorphous selenium which is photosensitive in the blue-green as well as in the red spectral range.

A further object of the invention is to provide a recording material which is distinguished by uniform photosensitivity over the entire photoconductive surface and which is substantially independent of the variables of spontaneous crystallization.

A still further object of the invention is to provide such a material having uniform characteristics which are attainable in a reproduceable manner by a relatively simple manufacturing process.

These and other objects are achieved, according to the present invention, in a process for producing an electrophotographic recording material composed of a double layer of amorphous and crystallized selenium applied to an electrically conductive substrate, by a procedure including vapor depositing tellurium onto the surface of the conductive, and possibly preheated, substrate, which has been prepared in a known manner, to a thickness of 10 to 500 nm and then vapor-depositing onto this tellurium layer a layer of selenium having a layer thickness of 20 to 100μ.

The present invention causes a uniform layer of crystallization seeds, whose formation is not dependent on chance, to be produced on the surface of the conductive substrate. The tellurium is always precipitated, by vapor deposition, in fully crystallized form, even without additional thermal treatment.

The fine tellurium crystals act as crystallization seeds for the selenium layer vapor-deposited thereonto. Thus, the process according to the present invention results in an uninterrupted, gap-free coverage of the substrate with crystallization seeds, with the result that the subsequently vapor-deposited selenium layer is grown in a very uniformly crystalline form.

Surprisingly, the intended crystalline selenium layer already forms, under the conditions conforming to the procedure of the present invention, during the vapor-deposition process to a thickness of 0.3 to 3μ and is distinguished by a very sharp transition, or interface, between the crystalline and amorphous layers. An additional tempering step after vapor deposition can thus be eliminated.

The method according to the invention thus provides an opportunity of producing the double layer of crystallized and amorphous selenium in a single process step, with formation of uniform individual layers. Consequently, the recording material produced in this way also exhibits the required uniform sensitivity over a wide spectral range and printed copies produced with this recording material are distinguished by high quality.

It is advisable to maintain the pressure at less than $10^{-4}$ mbar during the vapor deposition of the tellurium on the conductive substrate, the substrate being, for example, an aluminum disc or drum. Uniform coverage to the intended layer thickness is achieved in an advantageous manner by vapor depositing the tellurium from a heated molybdenum band onto which it had previously been applied in corresponding quantities. Alternatively, the vapor-deposition can take place from an open vessel as the evaporation source, the vessel having a length which corresponds to the length of the conductive substrate. The evaporation rate should be about 3 nm layer thickness/min so that for a preferred tellurium layer thickness of 20 to 50 nm the vapor deposition process is completed in about 7 to 17 minutes.

If the tellurium is vapor deposited onto a conductive substrate at temperatures of between 20° and 30° C., it is of advantage, in order to heat the conductive substrate for the subsequent selenium vapor deposition, to temporarily ventilate the vacuum chamber before this selenium vapor deposition and to bring the substrate during that time to a temperature of about 62° to 75°, the selenium deposition temperature whereupon the selenium is vapor deposited in approximately the same vacuum as for the tellurium deposition from an open crucible at a deposition rate of about 1 μ/min to a thickness of preferably 60μ. However, in view of the higher substrate temperature during the selenium deposition it is also possible to set a substrate temperature of about 60° C. right from the start for the tellurium deposition as well so that then the temporary ventilation and reheating can be eliminated.

One specific preferred embodiment of the invention will now be described.

An electrically conductive substrate in the form of a planar disc or a cylindrical drum, preferably of aluminum, is introduced into a vacuum chamber after its surface has been pretreated in the usual manner known for electrophotographic procedures, as described, for example, in U.S. Pat. No. 2,753,278, and its temperature has been increased by heating, possibly with the aid of a heated rotary shaft, to 62° to 65° C.

As soon as the pressure in the vacuum chamber has been reduced to below $10^{-4}$ mbar, tellurium is vapor deposited from a molybdenum band which has been designed as a heating resistor and has been coated with such a quantity of tellurium in uniform distribution that the intended layer thickness can be obtained on the conductive carrier. In order to obtain a coating on the conductive carrier which is as uniform as possible, the length of the molybdenum band should at least equal the length of the carrier or even exceed it somewhat. The vapor deposition rate for tellurium is selected so that in about 10 minutes a layer thickness of 30 nm is attained.

Upon complete evaporation of the tellurium from the molybdenum band, and disconnection of the same from its heating device while maintaining the vacuum and the substrate temperature, selenium is precipitated from an open evaporation vessel. For the above reasons of uniform distribution, the length of the evaporation vessel should be adapted to the length of the conductive carrier. The vapor deposition rate of the selenium should be about 1 μ/min so that after approximately 60 min the intended layer thickness of 60μ has been attained.

After cooling the evaporator and ventilating the vacuum chamber, the coated substrates can be removed. They carry the intended double photoconductor layer constituted by a layer of crystallized selenium 0.3 to 3μ thick, with amorphous selenium resting thereabove. The crystallized selenium layer exhibits particular uniformity as has been shown by electron microscopic photographs. The recording material can therefore be used to produce copies over a broad spectral sensitivity range and having substantially improved uniformity compared to conventional processes.

It will be understood that the above description of the present invention is susceptible to various modifications, changes and adaptations, and the same are intended to be comprehended within the meaning and range of equivalents of the appended claims.

What is claimed is:

1. In a process for producing an electrophotographic recording material composed of a double layer of amorphous and crystallized selenium on an electrically conductive substrate, the improvement comprising applying a layer of tellurium having a thickness of 10 to 500 nm onto the surface of the substrate, and then vapor-depositing selenium at a rate of about 1 $\mu$/min onto said tellurium layer to a thickness of 20 to 100$\mu$ while said substrate is at a temperature of 62°–75° C., to form a double layer comprising a crystallized selenium layer overlying the tellurium layer and an amorphous selenium layer overlying the crystallized selenium layer.

2. A process as defined in claim 1 wherein said step of vapor-depositing takes place at a pressure of less than $10^{-4}$ mbar.

3. A process as defined in claim 1 or 2 wherein said step of applying comprises vapor-depositing the tellurium at a rate of about 3 nm/min.

4. A process as defined in claim 1 or 2 comprising bringing the conductive substrate, before the start of said applying step, to a temperature of about 62° to 75° C. and said steps of applying and vapor-depositing are performed in succession in a single process step.

5. A process as defined in claim 1 or 2 wherein said step of applying is carried out by vapor-depositing the tellurium onto the conductive substrate at a temperature of 20° to 30° C. and comprising bringing the conductive substrate to a temperature of 62° to 75° C. before said step of vapor-depositing selenium.

6. Process according to claim 4, wherein said conductive substrate is brought to a temperature of about 62° to 65° C. before the start of said applying step.

* * * * *